United States Patent [19]

Yoshikawa

[11] Patent Number: 5,084,961
[45] Date of Patent: Feb. 4, 1992

[54] METHOD OF MOUNTING CIRCUIT ON SUBSTRATE AND CIRCUIT SUBSTRATE FOR USE IN THE METHOD

[75] Inventor: Minoru Yoshikawa, Tokyo, Japan

[73] Assignee: Micro Gijutsu Kenkyujyo Co., Ltd., Tokyo, Japan

[21] Appl. No.: 669,910

[22] Filed: Mar. 15, 1991

[30] Foreign Application Priority Data

Apr. 9, 1990 [JP] Japan .................. 2-92186
Feb. 15, 1991 [JP] Japan .................. 3-42433

[51] Int. Cl.$^5$ .............................. H05K 3/34
[52] U.S. Cl. .................. 29/840; 29/832; 357/74; 357/80; 361/388
[58] Field of Search .......... 29/827; 361/386, 387, 361/388, 389, 400; 174/260, 261; 357/74, 80

[56] References Cited

U.S. PATENT DOCUMENTS

| 4,285,002 | 8/1981 | Campbell | 29/827 X |
| 4,672,421 | 6/1987 | Lin | 357/74 X |
| 4,742,385 | 5/1988 | Kohmoto | 357/80 X |
| 4,867,235 | 9/1989 | Grapes et al. | 361/388 |

FOREIGN PATENT DOCUMENTS 53-14561  2/1978  Japan .................. 357/74
96692  6/1988  Japan .

OTHER PUBLICATIONS

IBM Tech Discl Bull, vol. 15, No. 11, Mar. 1973, p. 3024 by D. Balderes et al.

Primary Examiner—Carl J. Arbes
Attorney, Agent, or Firm—Edward D. C. Bartlett

[57] ABSTRACT

There is provided with a method of mounting a circuit on a substrate which utilizes advantages of the COG method, can enhance the yield and can reduce the cost, and a circuit substrate for use in the method.

A circuit pattern, including a pectinate connecting electrode having the same pitch interval as that of a pectinate marginal electrode on an electrode pattern formed on a substrate, is formed on a stick circuit substrate having the same coefficient of thermal expansion as that of the substrate and extending in the lateral or longitudinal direction of the margin of the substrate.

After the necessary number of circuits are directly mounted on the circuit substrate, the pectinate marginal electrode of the substrate and the corresponding pectinate electrode of the circuit substrate are electrically connected.

10 Claims, 3 Drawing Sheets

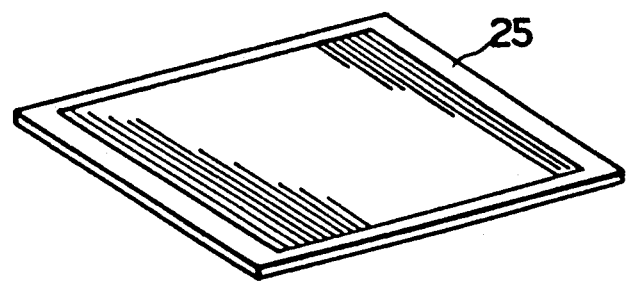
FIG. 3(a)
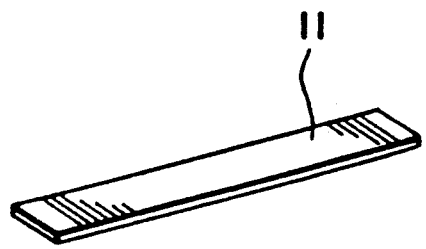
FIG. 3(b)
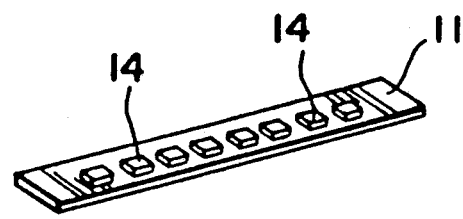
FIG. 3(c)
FIG. 4
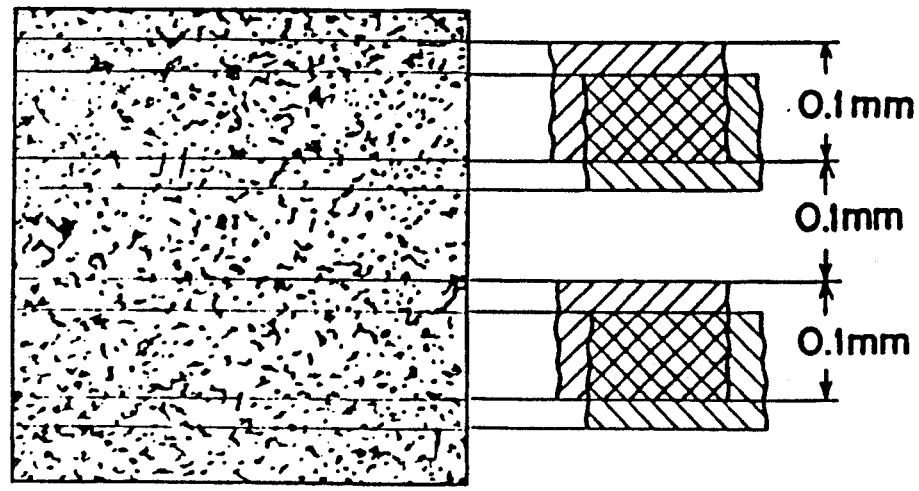

METHOD OF MOUNTING CIRCUIT ON SUBSTRATE AND CIRCUIT SUBSTRATE FOR USE IN THE METHOD

BACKGROUND OF THE INVENTION

1. Field of the Invention

The present invention relates to a method of mounting a drive circuit and the like on a substrate having a wide area, which is used in various kinds of flat displays, a liquid crystal sensor, a liquid crystal shutter or the like, and to a circuit substrate for use in the method and shaped in a stick.

2. Description of the Related Art

Flat panel display panels, such as a liquid crystal display, a plasma display, an electroluminescence (EL) display or a light emitting diode (LED) display, are popular as display devices. In each of these display panels, a transparent electrode, which constitutes many display dots (pixels) arranged in a matrix, is generally formed in a pattern on a transparent glass substrate with high precision, and a drive circuit and so on are connected to a pectinate electrode on the margin of the substrate.

Conventionally, in order to mount a drive circuit and the like on a display substrate of a display panel, for example, a method which connects an electrode of a printed board with a drive circuit mounted thereon and an electrode of a display substrate through a connector of a flexible circuit, or the like, is used. However, since the coloration and enlargement of a display has been recently advanced and the interelectrode pitch on a side of a panel has been narrowed, the Tape Automated Bonding (TAB) method, the Chip On Glass (COG) method or the like has come into use.

The TAB method bonds a drive element (chip), such as a semiconductor integrated circuit (IC), to a tape formed by laminating copper on a film carrier made of polyimide, polyester and so on and patterning an electrode thereon, and connects the tape and the drive chip to an electrode portion on the margin of a display substrate by soldering or thermocompression bonding. On the other hand, the COG method directly mounts a bare circuit element (bare chip) on the margin of a display substrate. In the case of the TAB method, since a resin film made of polyimide, polyester or the like is used for the tape, the interelectrode pitches of the tape and the display substrate differ due to the difference in coefficient of thermal expansion therebetween if the tape has a wide area. Therefore, it is difficult to connect the tape and the display substrate, and incorrect operations are likely to be caused after the connection. It is said that the limit of the pitch interval is approximately 100 μm. The COG method does not have such a limit and can cope with the increase in the number of pins in an IC with the increase in the number of pixels However, since such a conventional circuit mount method according to COG method directly mounts the chip on the display glass substrate, it is difficult to inspect, replace or repair a defective IC, and it is necessary to change a circuit pattern on the display glass substrate in accordance with the design of the IC. Therefore, a defect of a part of the wide glass substrate leads to a defect of the whole substrate, the yield is low, the cost is high, and it is difficult to merchandise a display panel.

SUMMARY OF THE INVENTION

An object of the present invention is to provide a method of mounting a circuit on a substrate which utilizes the advantages of the COG method, enhances the yield and reduces the cost, and a circuit substrate for use in the method.

In order to achieve the above object, there is provided a method of mounting a circuit on the margin of a substrate with an electrode pattern having a pectinate marginal electrode, which forms a circuit pattern, including a pectinate connecting electrode having the same pitch interval as that of the pectinate marginal electrode of the substrate, on a stick circuit substrate having the same coefficient of thermal expansion as that of the substrate and extending in the lateral or longitudinal direction of the margin of the substrate, directly mounts the necessary number of circuits on the circuit substrate, and then, electrically connects the pectinate marginal electrode of the substrate and the corresponding pectinate electrode of the circuit substrate. Furthermore, the circuit substrate of the present invention for use in the method has the same coefficient of thermal expansion as that of the substrate with the electrode pattern formed thereon, is shaped in a stick extending in the lateral or longitudinal direction of the margin of the substrate, and has the circuit pattern with the pectinate connecting electrode having the same pitch interval as that of the pectinate marginal electrode of the substrate on the surface thereof, and the necessary number of circuits directly mounted thereon.

According to the present invention, since the stick circuit substrate on which the necessary number of circuits are directly mounted has the same coefficient of thermal expansion as that of the substrate which constitutes a display panel or the like, no problem is caused by thermal expansion and an excellent connecting state is maintained after connecting the electrodes of the circuit substrate and the substrate with each other, the yield can be enhanced, the production process is simplified, and the cost is reduced.

BRIEF DESCRIPTION OF THE DRAWINGS

FIG. 3 is a perspective view showing a production process of the glass circuit substrate according to the first embodiment of the present invention;

FIG. 4 is an enlarged view showing a connecting state of the glass circuit substrate according to the first embodiment of the present invention;

DETAILED DESCRIPTION OF THE PREFERRED EMBODIMENTS

The present invention will now be specifically described with reference to illustrated embodiments.

Figure 1:
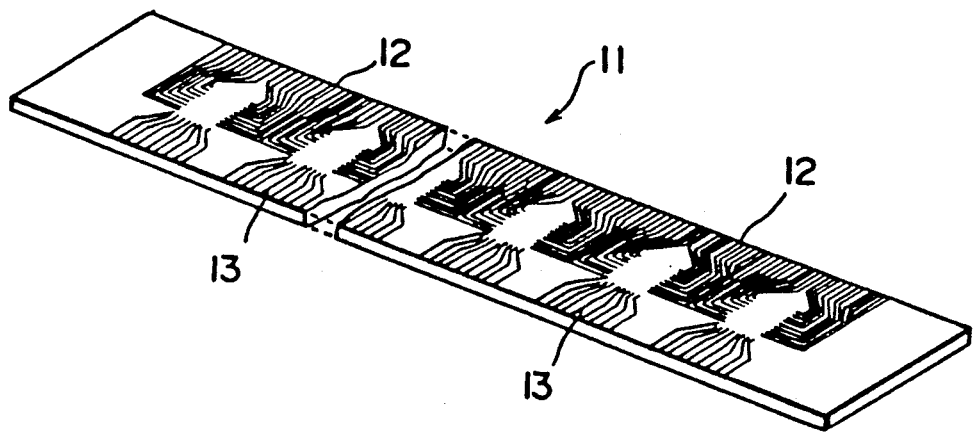
FIG. 1 is a perspective view of a glass circuit substrate according to a first embodiment of the present invention.

FIG. 1 is a perspective view of a glass circuit substrate according to a first embodiment of the present invention. Referring to FIG. 1, a glass circuit substrate 11 is provide with a drive circuit for a liquid crystal display panel mounted thereon, has the same coefficient of thermal expansion as that of the unillustrated liquid crystal panel, and is composed of a transparent glass substrate shaped in a stick having almost the same length as the longitudinal or lateral length of the margin of the panel. A circuit pattern to directly mount a semiconductor bare chip for driving a liquid crystal thereon is formed on the surface of the glass circuit substrate 11. A pectinate output electrode 12, having the same pitch as those of a scanning electrode and a data electrode formed on the margin of the liquid crystal panel, is formed on one side of the surface of the glass circuit substrate 11 in the longitudinal direction thereof. On the other side thereof, a pectinate input electrode 13 which is connected to a control circuit and so on mounted on an unillustrated printed board is formed. Furthermore, such a circuit pattern is formed in various kinds of shapes depending on the kind of a liquid crystal or an IC to be mounted. The corners of the glass circuit substrate 11 at which the output electrode 12 is formed are provided with unillustrated chamfers having approximately 0.5 to 1 mm in thickness in order to increase the bond strength.

FIG. 2 is a process view showing a circuit mount method according to the first embodiment of the present invention.

Figure 2A:
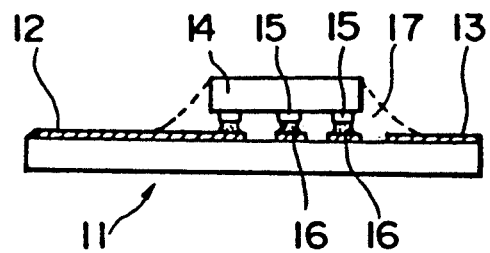
FIG. 2 is a process view showing a circuit mount method according to the first embodiment of the present invention.

As shown in FIG. 2(a), the necessary number of semiconductor chips 14 for a liquid crystal drive circuit are mounted on the circuit pattern of the glass circuit substrate 11 formed as shown in FIG. 1. Each of the semiconductor chips 14 is mounted by, for example, applying a conductive adhesive 16 on salient electrodes (bumps) 15 formed on the semiconductor chip 14, pressing the semiconductor chip 14 on the glass circuit substrate 11, conducting thermal processing and hardening thereon, and dripping a liquid sealing agent 17 so as to seal the semiconductor chip 14. As other mount methods of the semiconductor chip 14, wire bonding and so on are used.

Figure 2B:
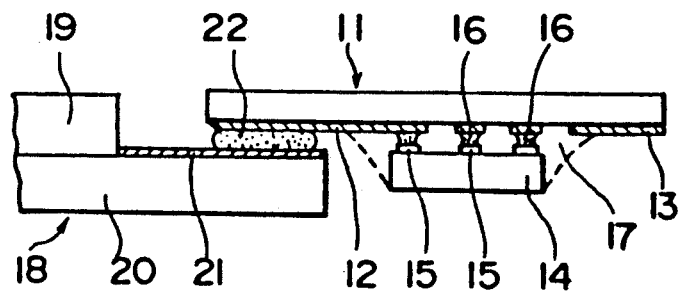

As shown in FIG. 2(b), the side of the glass circuit substrate 11 on which the semiconductor chips 14 are mounted is turned down. Then, a region to mount a drive circuit thereon is formed on a lower glass substrate 20 on the margin of a liquid crystal panel 18 composed of an upper glass substrate 19 and the lower glass substrate 20. An anisotropic conductive adhesive 22 containing metallic particles and so on is applied on the output electrode 12 of the glass circuit substrate 11 or the end of a pectinate marginal electrode 21 of the lower glass substrate 20, and the output electrode 12 of the glass circuit substrate 11 and the pectinate marginal electrode 21 of the lower glass substrate 20, which are opposite to each other, are properly positioned.

Figure 2C:
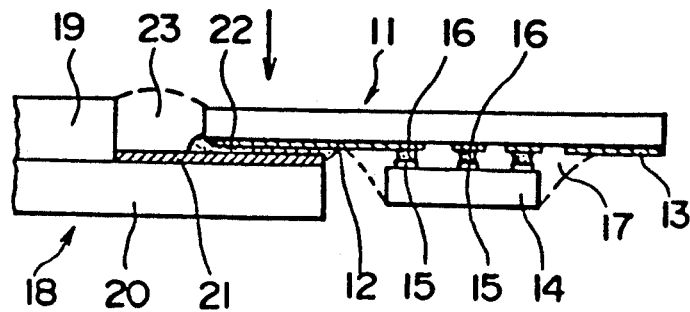

Subsequently, as shown in FIG. 2(c), the glass circuit substrate 11 is pressed against the lower glass substrate 20 and the anisotropic conductive adhesive 22 is hardened by heating. A liquid sealing agent 23 is dripped into an opening between the upper glass 19 of the lower glass substrate 20 and the glass circuit substrate 11 so as to seal the opening. Thereby, only parts of the upper and lower pectinate electrodes 12 and 21 opposite to each other are electrically conductive through the metallic particles and also mechanically adhered.

FIG. 3 is a perspective view showing a production process of the glass circuit substrate according to the first embodiment of the present invention.

As shown in FIG. 3(a), many circuit patterns for the glass circuit substrate 11 are continuously formed on the glass substrate 25 having the same coefficient of thermal expansion as that of the liquid crystal panel 18 and a wide area.

As shown in FIG. 3(b), the glass circuit substrate 11 shown in FIG. 1 is formed by cutting the glass substrate 25 into sticks.

Then, as shown in FIG. 3(c), the necessary number of the semiconductor chips 14 are mounted on the glass circuit substrate 11 in the manner shown in FIG. 2.

FIG. 4 is an enlarged view showing a connecting state of the glass circuit substrate according to the first embodiment of the present invention.

The figure is a schematic view of a photomicrograph which magnifies the electrode connecting state between the glass circuit substrate 11 and the lower glass substrate 20 fifty times, and shows the state after the anisotropic conductive adhesive is applied between the upper and lower electrodes and thermal processing is performed for a minute at approximately 180° C. The upper and lower electrodes each have a line width of 0.1 mm and a pitch of 0.2 mm, and are connected to each other with a slippage of approximately 0.02 mm. Referring to FIG. 4, black dots represent metallic particles. The areas with right and left slanted lines designate the upper and lower electrodes respectively, and the area where the right slanted lines and the left slanted lines intersect designates the portion where the upper and lower electrodes overlap with each other. It is confirmed that electrical continuity between the upper and lower electrodes is present in this intersection and that there is no continuity in the lateral direction thereof. Furthermore, the mechanical adhesive strength thereof is sufficient.

According to the above circuit mount method, since the glass circuit substrate 11 has the same coefficient of thermal expansion as that of the liquid crystal panel 18, even if many electrodes opposite to each other are connected at a time, no problem due to thermal expansion is caused after connecting the electrodes unlike the TAB method and a high-precision and excellent connecting state can be maintained. Furthermore, since it is possible to inspect defective chips after mounting the semiconductor chips 14 on the glass circuit substrate 11, the defective chips can be corrected more easily than in the case where the chips are directly mounted on the liquid crystal panel in the conventional manner, such as the COG method, and the yield can be enhanced by connecting the glass circuit substrate 11 and the display substrate, which are separately obtained and reliable. In addition, many glass circuit substrates 11 can be produced from the wide glass substrate 25 separately from the liquid crystal panel, thereby simplifying the production process and reducing the cost. Although the input electrode 13 is pectinate in the glass circuit substrate 11 of this embodiment, if an insulating film is formed on the input electrode 13 and wires are formed on the insulating film so as to perform multilayer interconnection, it is possible to interconnect the input electrode 13 or to make wiring in a specific area. If such multilayer interconnection is formed on the side of the glass circuit substrate 11, it is easier to flexibly cope with the design of the semiconductor chips 14 than the case in which the multilayer interconnection is directly formed on the side of the liquid crystal panel, and the cost is reduced.

Figure 5:
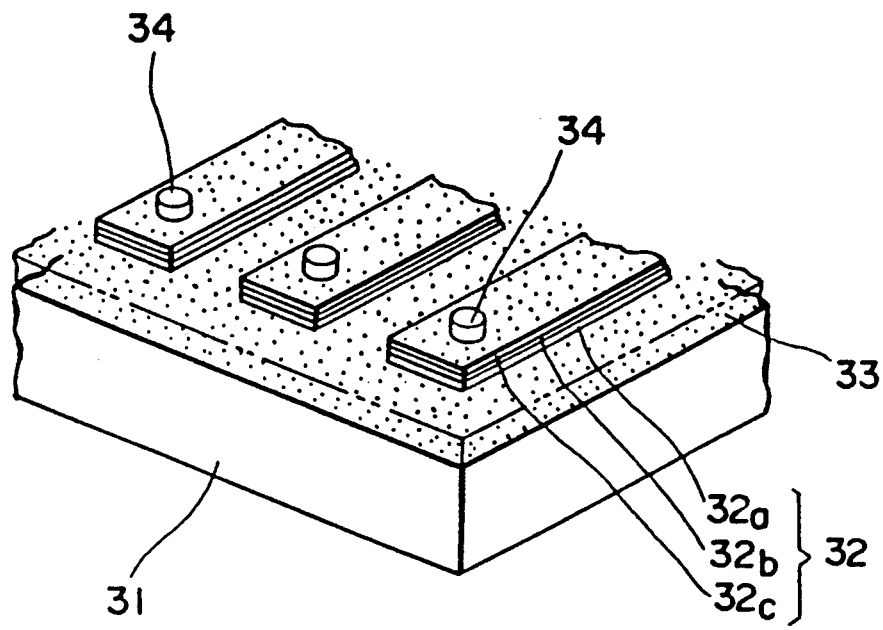
FIG. 5 is a perspective view of a glass circuit substrate according to a second embodiment of the present invention.

FIG. 5 is a perspective view of a glass circuit substrate according to a second embodiment of the present invention.

Referring to FIG. 5, a pectinate output electrode 32, which is formed on a glass circuit substrate 31 having the same coefficient of thermal expansion as that of the liquid crystal panel, is composed of an indium tin oxide (ITO) film 32a of approximately 0.2 μm in thickness, a nickel (Ni) film 32b of approximately 1 μm in thickness, and a gold (Au) film 32c of approximately 0.1 to 0.2 μm in thickness. After an insulating film 33 defined by a chain line and made of polyimide, epoxy or silicon oxide (SiO₂) is formed on the output electrode 32 of the glass substrate 31, a through-hole is formed on the end of the output electrode 32 and a soldering dam 34 is formed in the through-hole. By using the glass circuit substrate 31 thus formed, it is possible to solder the glass circuit substrate 31 and corresponding electrodes and semiconductor chips of the liquid crystal panel.

Problems due to thermal expansion are prevented from being caused the same as in the above embodiment, an excellent connecting state is maintained, the yield is enhanced, and the cost is reduced.

Figure 6:
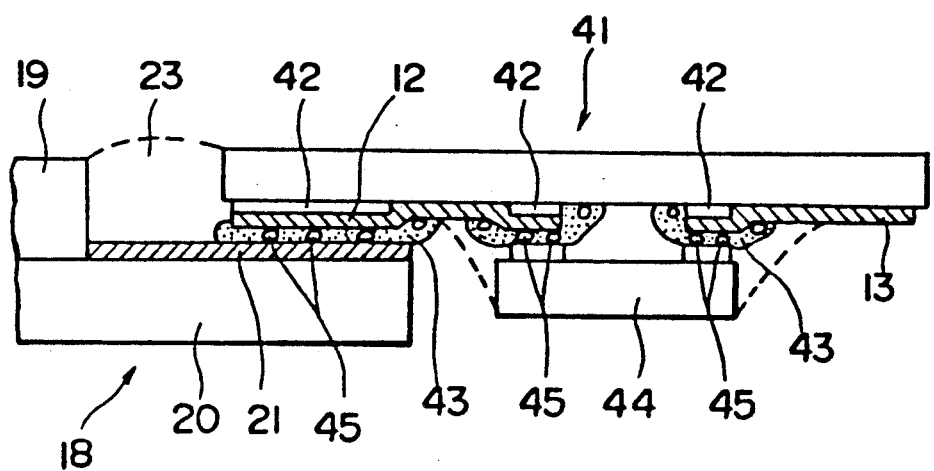
FIG. 6 is a view showing a circuit mount method according to a third embodiment of the present invention.

FIG. 6 shows a circuit mount method according to a third embodiment of the present invention. The same components as those in FIG. 2 are denoted by the same numerals.

In this embodiment, a glass circuit substrate 41 has the same coefficient of thermal expansion as that of the liquid crystal panel 18 as described above and is shaped in a stick. An electrode portion of the pectinate output electrode 12 on the glass circuit substrate 41 connected to the liquid crystal panel 18 and an electrode portion thereof connected to semiconductor chip 44 are formed on a step portion 42 of approximately 1 to 10 μm in height. The step portion 42 is made of an insulating material, such as polyimide, epoxy, silicon or silicon oxide, or formed by etching the surface of the glass circuit substrate 41. The semiconductor chip 44 is mounted on the glass circuit substrate 41 with the step portion by using an anisotropic conductive adhesive 43 and the glass circuit substrate 41 is connected to a corresponding electrode of the liquid crystal panel 18. In FIG. 6, numeral 45 denotes metallic particles in the anisotropic conductive adhesive 43, which are schematically shown.

If the anisotropic conductive adhesive 43 is used in this embodiment, the metallic particles 45 in the area of the glass circuit substrate 41 where the step portion 42 is formed are pressed and contribute to electrical continuity, while the metallic particles 45 in the area where the step portion 42 is not formed are not pressed and do not contribute to the electrical continuity. Therefore, the metallic particles 45 whose diameter is a little smaller than the diameter corresponding to the thickness of the step portion 42 can be used as the anisotropic conductive adhesive 43. Even if the size of the glass circuit substrate 41 in the longitudinal direction is made larger, the connection of the upper and lower electrode is not poor. Furthermore, as for the poor short-circuit between the adjoining right and left electrodes, an entire insulation is possible due to the anisotropic conductive adhesive 43 as a buffer. In other words, if the step portion 42 of the glass circuit substrate 41 is approximately 1 μm in thickness, the anisotropic conductive adhesive 43 containing the metallic particles 45 having a diameter of approximately 0.7 to 0.8 μm can be used, and if the step portion 42 is approximately 5 μm, the anisotropic conductive adhesive 43 containing the metallic particles 45 of approximately 4 μm in diameter can be used. Furthermore, since the step portion 42 is also formed on the side of the glass circuit substrate 41 where the semiconductor chip 44 is mounted, the electrode of the glass circuit substrate 41 and the electrode of the semiconductor chip 44 can be directly and electrically connected through the anisotropic conductive adhesive 43, it is unnecessary to form bumps on the side of the semiconductor chip 44. Thereby, the process of producing the chip 44 can be simplified and the cost can be reduced.

In the first embodiment, the anisotropic conductive adhesive 22 may be used after forming the insulating film and the through-holes on the electrode. In this case, if the interelectrode pitch is small, the though-holes are alternatively shifted and staggered, thereby achieving a substantially long distance between the electrodes and preventing continuity in the lateral direction. When the anisotropic conductive adhesive 22 or 43 is used, it is effective to form the electrode portions to be connected relatively thick in order to obtain an excellent electrical connecting state, and thereby, the interelectrode pitch can be shortened. Furthermore, when the anisotropic conductive adhesive 22 or 43 which contains metallic particles of 5 to 6 μm in diameter are used, the electrodes whose line width is 30 μm and whose pitch is 40 μm (the distance between the adjoining electrodes is 10 μm) can be connected.

It is only necessary that an arbitrary circuit pattern including the number, corresponding to the number of the scanning electrodes and the data electrodes of the liquid crystal panel, of pectinate electrodes, such as output electrodes, is formed on the glass circuit substrate 11, 31 or 41, and it is effective if the area of the display panel is wide and the number of electrodes to be connected at a time is large. Furthermore, it is possible to connect the electrodes by increasing the number of layers on the side of the semiconductor chip to be mounted and to simplify the circuit pattern. The circuit pattern may be formed by adhering copper foil.

Although the liquid crystal display panel is described as an example in the above embodiments, the present invention is applicable to a liquid crystal television, flat panels, such as a plasma display, an EL display and a LED display, and devices having many pectinate electrodes other than the display panel, such as a liquid crystal sensor and a liquid crystal shutter. The material of the circuit substrate may be ceramics or the like instead of glass.

As described above, according to the present invention, since the circuit substrate to mount a circuit thereon has the same coefficient of thermal expansion as that of the substrate of the display panel, no problem is caused by thermal expansion after adhering the electrodes, an excellent connecting state can be maintained, the yield can be enhanced, the production process can be simplified, and the cost can be reduced.

The above described embodiments, of course, are not to be construed as limiting the breadth of the present invention. Modifications, and other alternative constructions, will be apparent which are within the spirit and scope of the invention as defined in the appended claims.

What is claimed is:

1. A method of mounting a circuit on the margin of a substrate with an electrode pattern having a pectinate marginal electrode, comprising the steps of:

forming a circuit pattern, including a pectinate connecting electrode having the same pitch interval as that of said pectinate marginal electrode of said substrate, on a stick circuit substrate having the same coefficient of thermal expansion as that of said substrate and extending in the lateral or longitudinal direction of the margin of said substrate;

directly mounting the necessary number of circuits on said circuit substrate; and electrically connecting said pectinate marginal electrode of said substrate and said pectinate electrode of said circuit substrate opposite thereto.

2. A method of mounting circuitry on a substrate, comprising the steps of:

providing a main substrate having an electrode pattern, the main substrate having a margin portion extending in a longitudinal direction and provided with a pectinate marginal electrode;

forming an elongate, stick-shaped substrate having a circuit pattern thereon, the circuit pattern including a pectinate connecting electrode compatible with said pectinate marginal electrode, said stick-shaped substrate and said main substrate having equal coefficients of thermal expansion, and the stick-shaped substrate being elongate in a lengthwise direction;

separately mounting a plurality of discrete circuit units on said stick-shaped substrate;

superimposing at least a portion of said stick-shaped substrate over said margin portion of said main substrate with said lengthwise direction of said stick-shaped substrate extending in said longitudinal direction of said margin portion; and attaching said superimposed stick-shaped substrate to said main substrate margin portion with said pectinate marginal electrode and said pectinate connecting electrode registering with each other and being electrically connected.

3. The method of claim 2, wherein said attaching step includes locating between said pectinate marginal electrode and said pectinate connecting electrode conductive adhesive containing metallic particles, and then pressing said stick-shaped substrate and said main substrate together to squeeze said adhesive.

4. The method of claim 3, wherein a heating step is performed to harden said conductive adhesive.

5. The method of claim 2, including the step of forming a plurality of circuit patterns on a glass substrate, and then cutting said glass substrate into elongate sticks to provide said stick-shaped substrate.

6. The method of claim 2, wherein said pectinate connecting electrode is an output electrode, and further comprising the steps of:

forming said output electrode by superimposing film layers of indium tin oxide, nickel, and gold on a glass circuit substrate; then forming an insulating film over said output electrode; then making a through-hole in an end part of said output electrode; and then forming a soldering dam in said through-hole; and wherein said attaining step comprises soldering said output electrode to said main substrate.

7. The method of claim 2 wherein said main substrate comprises a liquid crystal panel.

8. The method of claim 7 wherein said discrete circuit units comprise semiconductor chips.

9. The method of claim 7 wherein said liquid crystal panel is formed by superimposing upper and lower glass substrates.

10. The method of claim 9, wherein the lower glass substrate is caused to extend beyond the upper glass substrate to thereby form said margin portion on said lower glass substrate.

* * * * *